United States Patent
Park

(10) Patent No.: US 8,921,915 B2
(45) Date of Patent: Dec. 30, 2014

(54) NONVOLATILE MEMORY DEVICE AND METHOD FOR FABRICATING THE SAME

(71) Applicant: SK Hynix Inc., Gyeonggi-do (KR)

(72) Inventor: Sung-Kun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/961,294

(22) Filed: Aug. 7, 2013

(65) Prior Publication Data
US 2014/0312405 A1 Oct. 23, 2014

(30) Foreign Application Priority Data

Apr. 18, 2013 (KR) .................. 10-2013-0042914

(51) Int. Cl.
*H01L 29/788* (2006.01)

(52) U.S. Cl.
CPC .................................. *H01L 29/788* (2013.01)
USPC .................. 257/315; 257/314; 257/E29.129; 257/E29.3; 257/E21.179; 257/E21.422

(58) Field of Classification Search
CPC ............ H01L 29/788; H01L 29/66825; H01L 29/7881; H01L 29/42324
USPC .................. 257/239, 240, 314, 315, E29.129, 257/E29.3, E21.179, E21.422, E21.68
See application file for complete search history.

(56) References Cited

U.S. PATENT DOCUMENTS

| | | | |
|---|---|---|---|
| 4,423,371 A * | 12/1983 | Senturia et al. | 324/663 |
| 6,806,529 B1 | 10/2004 | Hopper et al. | |
| 8,243,510 B2 | 8/2012 | Chen et al. | |
| 2004/0113198 A1* | 6/2004 | Mitros | 257/316 |
| 2008/0135904 A1* | 6/2008 | Roizin et al. | 257/298 |
| 2008/0291728 A1* | 11/2008 | Terzioglu et al. | 365/185.08 |

* cited by examiner

*Primary Examiner* — Eduardo A Rodela
(74) *Attorney, Agent, or Firm* — IP & T Group LLP

(57) ABSTRACT

A nonvolatile memory device includes a multi-finger type control gate formed over a substrate, a multi-finger type floating gate formed over the substrate and disposed close to the control gate with gaps defined therebetween, and spacers formed on sidewalls of the control gate and the floating gate, and filling the gaps.

23 Claims, 14 Drawing Sheets

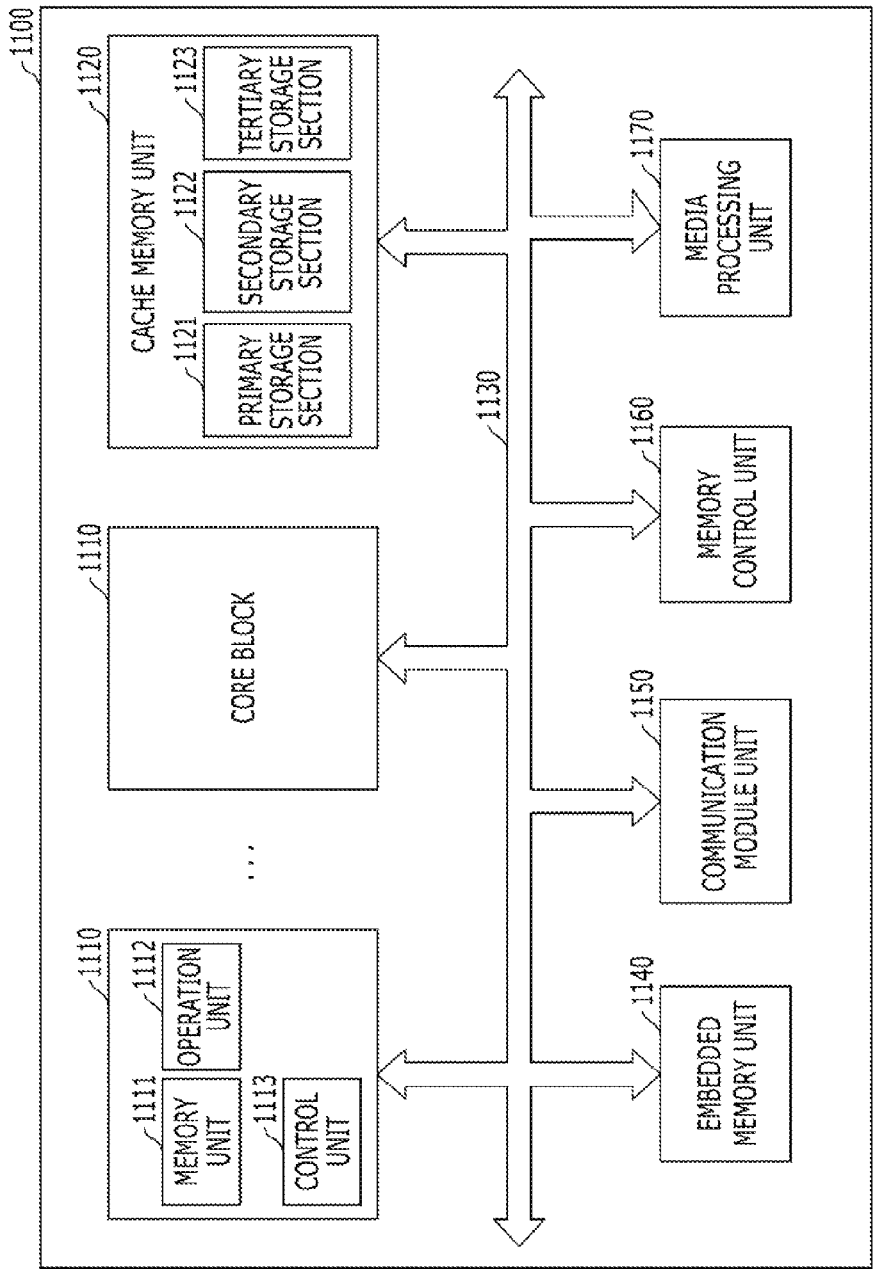

NONVOLATILE MEMORY DEVICE AND METHOD FOR FABRICATING THE SAME

CROSS-REFERENCE TO RELATED APPLICATIONS

The present application claims priority of Korean Patent Application No. 10-2013-0042914, filed on Apr. 18, 2013, which is incorporated herein by reference in its entirety.

BACKGROUND

1. Field

Exemplary embodiments relate to a semiconductor device fabrication technology, and more particularly, to a nonvolatile memory device and a method for fabricating the same.

2. Description of the Related Art

With a technological advancement in digital media devices, anyone may conveniently access desired information anytime and anywhere. As a conversion is made from analog to digital, a variety of digital devices have required storage media that may conveniently store captured images, recorded music and various data. In order to meet this requirement, there is a growing interest in the field of system-on-chip (SoC) according to a tendency for a high degree of integration of non-memory semiconductors, and semiconductor manufacturers compete to invest in the field of SoC in an effort to strengthen an SoC-based technology. The SoC means that system technologies are integrated in one semiconductor. If a system design technology is not secured, it may be difficult to develop non-memory semiconductors.

In the field of SoC where complicated technologies are integrated, a need for an embedded memory to trim an analog device or store an internal operation algorithm is gradually increasing as a chip with a composite function in which a digital circuit and an analog circuit are mixed is often used recently. Research for a flash EEPROM (electrically erasable programmable read-only memory) as an embedded memory has been actively conducted. This is because the flash EEPROM is a highly integrated nonvolatile memory device that may store data even in a power-off state like a ROM and may electrically erase and program data. EEPROMs include a single gate EEPROM having one gate (for example, a floating gate), a stack gate (ETOX) EEPROM in which two gates (for example, a floating gate and a control gate) are vertically stacked, a dual gate EEPROM that corresponds to the middle of the single gate EEPROM and the stack gate EEPROM, and a split gate EEPROM.

Because the characteristics of an analog device easily change by process variables, an embedded memory to be applied to a system-on-chip including an analog device may be fabricated on the basis of a CMOS process or a logic process while suppressing a separate process from being added to form the memory, so that the number of process variables is minimized.

However, in the conventional art, since the EEPROMs other than the single gate EEPROM may need an additional process besides a logic process, limitations may exist in applying the stack gate EEPROM, the dual gate EEPROM, and the split gate EEPROM to an embedded memory. Conversely, while the single gate EEPROM may be formed on the basis of a logic process without a separate additional process, since a floating gate may be coupled using an impurity region that is formed in a substrate, that is, a well, a disadvantage may be caused in that the degree of integration may be degraded.

SUMMARY

Various exemplary embodiments of the present invention are directed to a nonvolatile memory device that may improve the degree of integration and may conform to a logic process to be fabricated without a separate process, and a method for fabricating the same.

In accordance with an exemplary embodiment of the present invention, a nonvolatile memory device may include a multi-finger type control gate formed over a substrate, a multi-finger type floating gate formed over the substrate and disposed close to the control gate with gaps defined therebetween, and spacers formed on sidewalls of the control gate and the floating gate, and filling the gaps.

In accordance with another exemplary embodiment of the present invention, a nonvolatile memory device includes an isolation layer formed over a substrate to define a first active region and a second active region, a control gate formed over the isolation layer, a floating gate formed over the isolation layer, and disclosed close to the control gate with gaps defined therebetween, wherein the floating gate includes a first extension part and a second extension part extending onto the first active region and the second active region, respectively, and spacers formed on sidewalls of the control gate and the floating gate, and filling the gaps.

In accordance with still another exemplary embodiment of the present invention, a nonvolatile memory device may include an isolation layer formed over a substrate to define a first active region, a pick-up region and a second active region, a control gate formed over the isolation layer, a floating gate formed over the isolation layer, and disposed close to the control gate with gaps defined therebetween, wherein the floating gate includes a first extension part and a second extension part extending onto the first active region and the second active region, respectively, a select gate disposed side by side with the first extension part over the first active region, and spacers formed on sidewalls of the control gate, the floating gate and the select gate, and filling the gaps.

The nonvolatile memory device may further comprise: a first well formed in the substrate and including the first active region and the pick-up region; and a second well formed in the substrate, including the second active region, and having a conductivity type complementary to the first well. The first well and the second well may be disposed side by side so that one of sidewalls thereof contact each other.

The pick-up region may be disposed more adjacent to the first extension part than the select gate.

A distance between the select gate and the first extension part may be substantially the same or greater than a width of each of the gaps.

The floating gate and the control gate may be disposed on a same plane so that at least one sidewall of the floating gate and the control gate face each other.

In accordance with still another exemplary embodiment of the present invention, a method for fabricating a nonvolatile memory device may include forming a gate conductive layer on a substrate, selectively etching the gate conductive layer, and forming a multi-finger type control gate and a multi-finger type floating gate disposed close to the control gate with gaps defined therebetween, and forming spacers on sidewalls of the floating gate and the control gate to fill the gaps.

In accordance with still another exemplary embodiment of the present invention, a method for fabricating a nonvolatile memory device may include forming a gate conductive layer on a substrate; selectively etching the gate conductive layer, and forming a multi-finger type control gate and a multi-finger type floating gate disposed close to the control gate with gaps defined therebetween; and forming spacers on sidewalls of the floating gate and the control gate to fill the gaps.

The floating gate and the control gate may be formed to have shapes interdigitating with each other.

Before the forming of the gate conductive layer, the method may further comprise forming an isolation layer in the substrate to define active regions, wherein the control gate and the floating gate are disposed on the isolation layer. The floating gate may comprise extension parts extending onto the active regions.

The floating gate and the control gate may be disposed on a same plane so that at least one sidewall of the floating gate and the control gate face each other.

BRIEF DESCRIPTION OF THE DRAWINGS

FIG. 7 is a configuration diagram of a processor in accordance with another embodiment of the present invention.

DETAILED DESCRIPTION

Figure 1A:
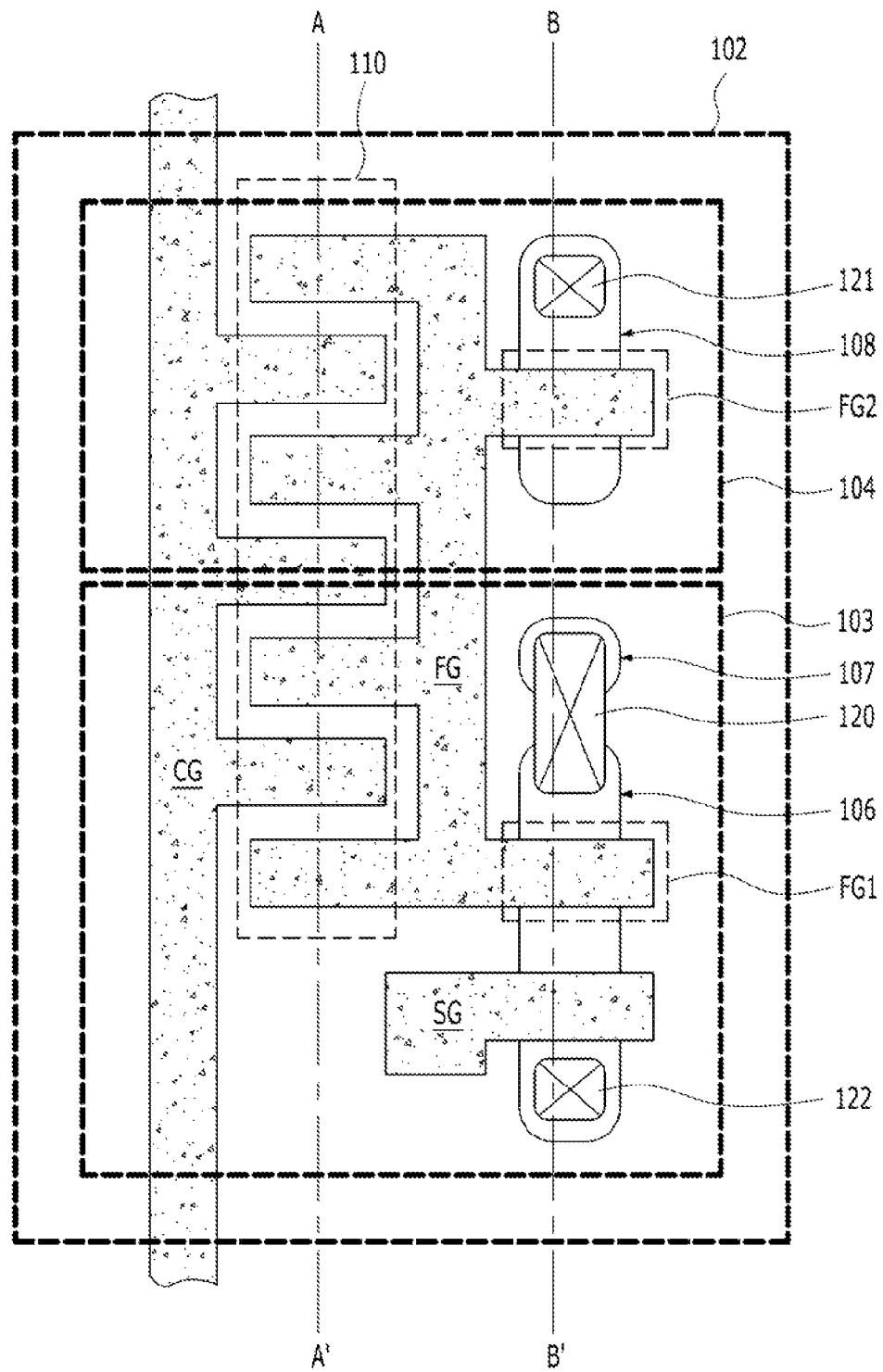
FIGS. 1A to 1C are views illustrating a unit cell of a nonvolatile memory device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. It is also noted that in this specification, "connected/coupled" refers to one component not only directly coupling another component but also indirectly coupling another component through an intermediate component. In addition, a singular form may include a plural form as long as it is not specifically mentioned in a sentence.

Embodiments of the present invention that will be described below provide a nonvolatile memory device that is easily applicable to an embedded memory, and a method for fabricating the same. In particular, embodiments of the present invention provide a nonvolatile memory device that is easily applicable to an embedded memory in system-on-chip (SoC), including an analog device and so forth, and a method for fabricating the same. To this end, embodiments of the present invention provide a nonvolatile memory device, which may be fabricated without a separate process in conformity with a logic process, like a single gate EEPROM among flash EEPROMs that have excellent utilization as embedded memories, and which may have the improved degree of Integration compared to the single gate EEPROM, and a method for fabricating the same.

For reference, in a single gate EEPROM that is generally known in the art, because an impurity region such as a well that is formed in a substrate is used to couple a floating gate, a fabrication process conforms to a logic process and thus a separate process may not be needed. However, in the single gate EEPROM, because a well with at least a predetermined area may be needed to couple the floating gate, limitations exist in improving the degree of integration. In all of a stack gate EEPROM in which a floating gate and a control gate are vertically stacked, a dual gate EEPROM in which a control gate and a floating gate are disposed side by side and a split gate EEPROM in which a control gate covers one side of a floating gate, since a control gate for coupling a floating gate is separately provided, the degree of integration may be improved. However, since the floating gate and the control gate may not be simultaneously formed, a separate process other than a logic process may be needed.

Meanwhile, in the following descriptions, a first conductivity type and a second conductivity type mean complementary conductivity types. Namely, if the first conductivity type is a P type, the second conductivity type is an N type, and, if the first conductivity type is an N type, the second conductivity type is a P type. This means that a nonvolatile memory device in accordance with embodiments of the present invention may be an N-channel type or a P-channel type. Hereinafter, for the sake of convenience in explanation, the first conductivity type will be described as a P type and the second conductivity type will be described as an N type. That is to say, descriptions will be made below by exemplifying an N-channel type nonvolatile memory device.

Figure 1B:
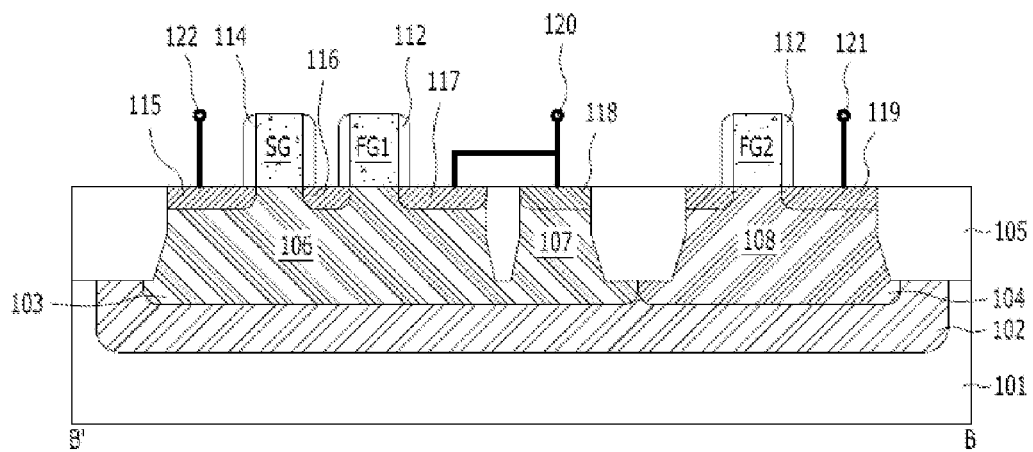
Figure 1C:
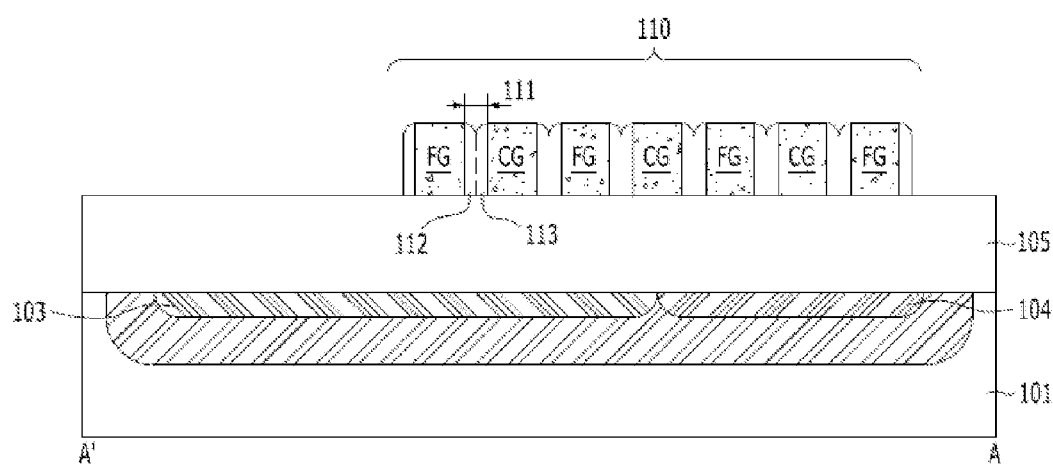

FIGS. 1A to 1C are views illustrating a unit cell of a nonvolatile memory device in accordance with an embodiment of the present invention. In detail, FIG. 1A is a plan view, and FIGS. 1B and 1C are cross-sectional views taken along the lines B-B' and A-A', respectively, of FIG. 1A.

Referring to FIGS. 1A to 1C, the nonvolatile memory device in accordance with an embodiment of the present invention includes a second conductivity type deep well 102 that is formed in a substrate 101, and a first conductivity type first well 103 and a second conductivity type second well 104, which are formed in the deep well 102. The first well 103 and the second well 104 have shapes, which are formed in the substrate 101 and are disposed side by side while sidewalls thereof contact each other. The substrate 101 may include a semiconductor substrate. The semiconductor substrate may be a single crystalline state, and may include a silicon-containing substance. That is to say, the semiconductor substrate may include a single crystalline silicon-containing substance. For instance, the substrate 101 may be a bulk silicon substrate, or an SOI (silicon-on-insulator) substrate in which a supporting substrate, a buried dielectric layer and a single crystalline silicon layer are sequentially stacked. The deep well 102, the first well 103 and the second well 104 may provide bases on which a unit cell may operate, and may be formed by ion-implanting impurities into the substrate 101. The first well 103 provides a base for a program operation and a read operation and may be formed by ion-implanting impurities of the first conductivity type, for example, boron (B). The second well 104 provides a base for an erase operation, and the deep well 102 provides a base for the erase operation and may improve an electrical isolation characteristic between the first well 103 and the second well 104. The deep well 102 and the second well 104 may be formed by ion-implanting impurities of the second conductivity type, for example, phosphor (P) and/or arsenic (As).

The nonvolatile memory device in accordance with the embodiment further includes an isolation layer 105 that is formed in the substrate 101 and defines a first active region 106 and a pick-up region 107 in the first well 103 and a second active region 108 in the second well 104. The isolation layer 105 may be formed through a shallow trench isolation (STI) process, and may include a dielectric layer. The bottom surfaces of the first well 103 and the second well 104 may be positioned below the bottom surface of the isolation layer 105. Also, the bottom surfaces of the first well 103 and the second well 104 may be positioned above the bottom surface of the isolation layer 105. Portions of the first well 103 and the second well 104 may be opened by the isolation layer 105 and may be respectively defined as the first active region 106 and the second active region 108. The first active region 106 and the second active region 108 may be bar types that have major axes and minor axes, or line types. The pick-up region 107 is a region for applying a bias to the first well 103. A portion of the first well 103 may be open by the isolation layer 105 and may be defined as the pick-up region 107. The pick-up region 107 may have a shape that is disposed on one side of the first active region 106 to be separated from the first active region 106 by the isolation layer 105, or may have a shape that is adjacent to one side of the first active region 106.

The nonvolatile memory device in accordance with the embodiment further includes a floating gate FG that is formed on the isolation layer 105, a control gate CG that is formed on the isolation layer 105 and disposed close to the floating gate FG with gaps 111 defined therebetween, and spacers 112 and 113 that are formed on the sidewalls of the floating gate FG and the control gate CG and fill the gaps 111. The floating gate FG serves to store logic information, and the control gate CG serves to couple parts of the floating gate FG. Each of the floating gate FG and the control gate CG may have a shape in which a gate dielectric layer (not shown), a gate electrode and a gate hard mask layer (not shown) are sequentially stacked. Although it is illustrated in the drawing that each of the floating gate FG and the control gate CG has a planar gate structure, each of the floating gate FG and the control gate CG may have a three-dimensional gate structure, for example, a fin gate structure. The floating gate FG and the control gate CG may include the same substance or different substances. For instance, the floating gate FG may include a silicon-containing substance, and the control gate CG may include a silicon-containing substance or a metal-containing substance.

The floating gate FG and the control gate CG may be disposed on the same plane and may have shapes in which at least one of sidewalls thereof face each other. Due to this fact, it may be demonstrated that the floating gate FG and the control gate CG may be realized on the basis of a logic process without using a separate process, as will be described later in detail in a method for fabricating a nonvolatile memory device.

In the nonvolatile memory device in accordance with the embodiment, the floating gate FG and the control gate CG may be multi-finger types. This is to increase the coupling rate between the control gate CG and the floating gate FG. To this end, the control gate CG and the floating gate FG may have shapes in which multiple fingers thereof are alternately arranged with each other, that is, interdigitate with each other. Hereinafter, for the convenience of explanation, a region where the control gate CG and the floating gate FG interdigitate with each other will be referred to as a coupling region 110. In the coupling region 110, the control gate CG and the floating gate FG may have sidewalls that face each other.

In detail, the gaps 111 each with a predetermined dimension are defined between the control gate CG and the floating gate FG. The width of each gap 111 may be a width through which the floating gate FG may be coupled by, for example, a bias in the range of 10 nm to 200 nm, applied to the control gate CG. As the width of each gap 111 decreases, the coupling rate between the control gate CG and the floating gate FG increases. The gaps 111 may have shapes that are filled by a dielectric layer, and the dielectric layer that fills the gaps 111 serves as a dielectric layer, for example, an inter-poly dielectric (IPD), which insulates the control gate CG and the floating gate FG from each other. The dielectric layer may be the spacers 112 and 113, which are formed on the sidewalls of the floating gate FG and the control gate CG. In other words, the gaps 111 may have shapes that are filled by the spacers 112 and 113 that are formed on the sidewalls of the floating gate FG and the control gate CG. Each of the spacers 112 and 113 may include any one single layer selected from the group that includes an oxide layer, a nitride layer and an oxynitride layer, or a stack layer in which at least two layers thereof are stacked.

In the nonvolatile memory device in accordance with the embodiment, the floating gate FG includes a first extension part FG1, which extends to and overlaps with the first active region 106, and a second extension part FG2, which extends to and overlaps with the second active region 108. The first extension part FG1 serves to provide a path through which charges, that is, electrons or holes are injected into the floating gate FG from the first well 103 in the program operation and to permit a threshold voltage change by which presence and absence of charges in the floating gate FG in the read operation may be determined. The second extension part FG2 serves to provide a path through which charges in the floating gate FG are discharged into the second well 104 in the erase operation.

The nonvolatile memory device in accordance with the embodiment further includes a select gate SG that is formed on the first active region 106 and is disposed side by side with the first extension part FG1 of the floating gate FG while being separated therefrom by a predetermined distance, spacers 114 that are formed on the sidewalls of the select gate SG, a drain region 115 that is formed in the first active region 106 adjacent to the select gate SG, a source region 117 that is formed in the first active region 106 adjacent to the first extension part FG1, and a connection region 116 that is formed in the first active region 106 between the select gate SG and the first extension part FG1. The select gate SG is for the read operation, and the distance between the first extension part FG1 and the select gate SG may be substantially the same or greater than the distance between the floating gate FG and the control gate CG in the coupling region 110, that is, the gap 111. The connection region 116 may serve as a conductive path that connects a channel induced by the select gate SG and a channel induced by the first extension part FG1. The source region 117, the drain region 115 and the connection region 116 may be formed by ion-implanting impurities of the second conductivity type into the substrate 101, and may have LDD structures.

The nonvolatile memory device in accordance with the embodiment further includes a first node 120 that is connected with the pick-up region 107, a second node 121 that is connected with the second active region 108, and a third node 122 that is connected with the drain region 115 of the first active region 106. The first node 120 may be connected to not only the pick-up region 107 but also the source region 117 of the first active region 106. Namely, the pick-up region 107 and the source region 117 of the first active region 106 may share the first node 120.

The first node 120 means a structure for applying a bias, for example, a bias for the program operation, to the first well 103, and may include a first impurity region 118 that is formed in the pick-up region 107 and a first plug (not shown) on the first impurity region 118. The first impurity region 118 may be formed by ion-implanting impurities of the first conductivity type and may have an impurity doping concentration higher than that of the first well 103. The second node 121 means a structure for applying a bias, for example, a bias for the erase operation, to the second well 104, and may include a second impurity region 119 that is formed in the second active region 108 on one side of the second extension part FG2 and a second plug (not shown) on the second impurity region 119. The second impurity region 119 may be formed by ion-implanting impurities of the second conductivity type and may have an impurity doping concentration higher than that of the second well 104. The third node 122 means a structure for applying a bias for the read operation, and may include the drain region 115 and a third plug (not shown) on the drain region 115.

As can be readily seen from the above descriptions, in the nonvolatile memory device in accordance with the embodiment, since the control gate CG is provided, the degree of integration of the nonvolatile memory device may be effectively improved.

Also, in the nonvolatile memory device in accordance with the embodiment, since the floating gate FG and the control gate CG have the coupling region 110 in a multi-finger type, the coupling rate between the floating gate FG and the control gate CG may be increased. Further, because the coupling rate increases as the width of the gap 111 between the floating gate FG and the control gate CG decreases, an operation characteristic may further improve as the degree of integration is increased.

Moreover, since the control gate CG is formed on the isolation layer 105 and the first well 103 and the second well 104 are separated from the control gate CG by the isolation layer 105, it is possible to apply biases with different polarities to the control gate CG, the first well 103 and the second well 104. Through this, the size of a peripheral circuit for supplying biases to a memory cell may be decreased.

Furthermore, due to the fact that the control gate CG to be applied with a relatively high bias is disposed on the isolation layer 105, the occurrence of a fail caused by the breakdown of a gate dielectric layer may be prevented.

In addition, because the floating gate FG and the control gate CG are disposed on the same plane so that at least one of sidewalls thereof faces each other, the nonvolatile memory device on the basis of a logic process may be fabricated without using a separate process.

Hereinbelow, operations of a unit cell of the nonvolatile memory device in accordance with the embodiment will be described with reference to FIGS. 1A to 1C and Table 1. Table 1 shows exemplary operating conditions of the unit cell of the nonvolatile memory device in accordance with the embodiment.

TABLE 1

| Class. | Scheme | Control Gate | Select Gate | First Node | Second Node | Third Node |
|---|---|---|---|---|---|---|
| Program | FN tunneling | VPP | VSS | −VPP | VSS | VSS |
| Erase | FN tunneling | −VPP | VSS | VPP | VSS | VSS |
| Read | — | VSS | VCC | VSS | VSS | Vread (~1V) |

First, a program operation may use an FN tunneling scheme. In detail, the program operation may be performed to supply a first program voltage and a second program voltage with different polarities to the control gate CG and the first node 120, respectively. The first program voltage may be a positive voltage, and the second program voltage may be a negative voltage. For instance, the first program voltage may be a pumping voltage VPP, and the second program voltage may be a minus pumping voltage −VPP. For reference, VSS is a ground voltage.

As the pumping voltage VPP is supplied to the control gate CG, the floating gate FG is coupled according to the coupling rate between the control gate CG and the floating gate FG. By the FN tunneling induced owing to a voltage difference between the coupled floating gate FG and the first well 103 supplied with the minus pumping voltage −VPP through the first node 120, a unit cell may be programmed through a series of procedures in which electrons are injected from the first well 103 into the first extension part FG1 of the floating gate FG.

Second, an erase operation may use an FN tunneling scheme. In detail, the erase operation may be performed to supply a first erase voltage and a second erase voltage with different polarities to the control gate CG and the second node 121, respectively. The first erase voltage may be a negative voltage and the second erase voltage may be a positive voltage. For instance, the first erase voltage may be the minus pumping voltage −VPP and the second erase voltage may be the pumping voltage VPP.

As the minus pumping voltage −VPP is supplied to the control gate CG, the floating gate FG is coupled with a negative voltage according to the coupling rate between the control gate CG and the floating gate FG. By the FN tunneling induced owing to a voltage difference between the coupled floating gate FG and the second well 104 supplied with the pumping voltage VPP through the second node 121, a unit cell may be erased through a series of procedures in which electrons are discharged from the second extension part FG2 of the floating gate FG to the second well 104.

Third, a read operation may be performed to supply an activation voltage and a read voltage to the select gate SG and the third node 122, respectively. Both the activation voltage and the read voltage may be positive voltages. The activation voltage is used to induce a channel below the select gate SG, and may be a power supply voltage VCC. The read voltage is used to determine whether or not a channel is to be formed under the first extension part FG1, according to presence or absence of charges in the floating gate FG, and may be a voltage with the magnitude of about ~1V.

Hereinbelow, the fact that the nonvolatile memory device in accordance with the embodiment of the present invention may be formed in conformity with a logic process without using a separate process will be explained in detail with reference to FIGS. 2A to 2D and FIGS. 3A to 3D, through a method for fabricating the nonvolatile memory device having the above-described structure. For reference, in the following descriptions for the fabricating method, components with the same technical terms are the same as the corresponding components described above with reference to FIGS. 1A to 1C even though they have different reference numerals.

FIGS. 2A to 2D and 3A to 3D are cross-sectional views illustrating the processes of a method for fabricating the unit cell of a nonvolatile memory device in accordance with the embodiment of the present invention. FIGS. 2A to 2D are cross-sectional views taken along the line B-B' of FIG. 1A, and FIGS. 3A to 3D are cross-sectional views taken along the line A-A' of FIG. 1A.

Figure 2A:
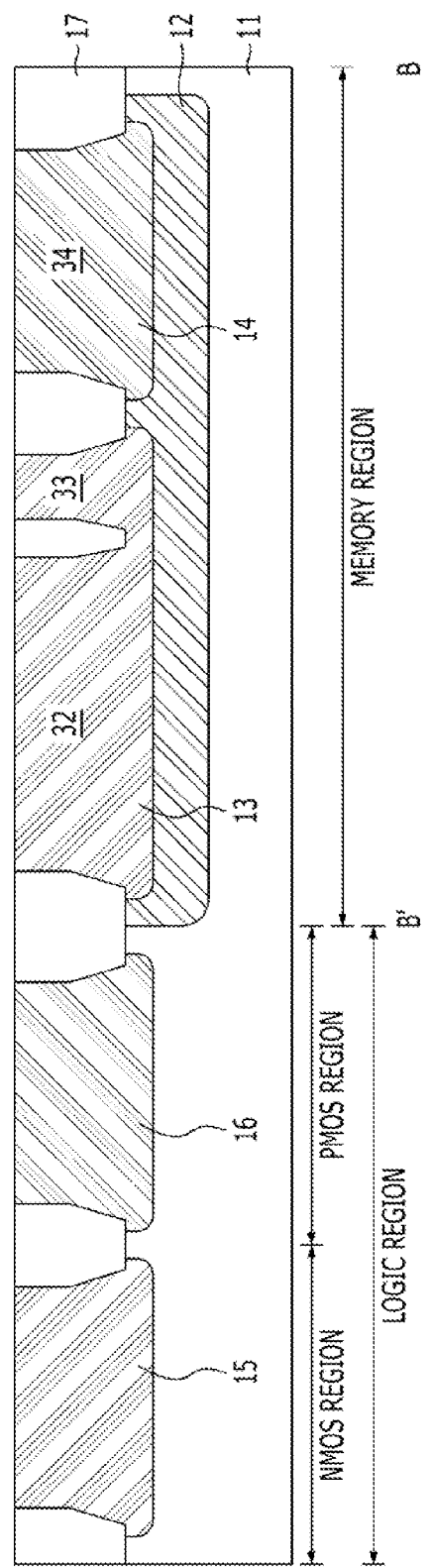
FIGS. 2A to 2D and 3A to 3D are cross-sectional views illustrating the processes of a method for fabricating the unit cell of a nonvolatile memory device in accordance with the embodiment of the present invention.
Figure 3A:
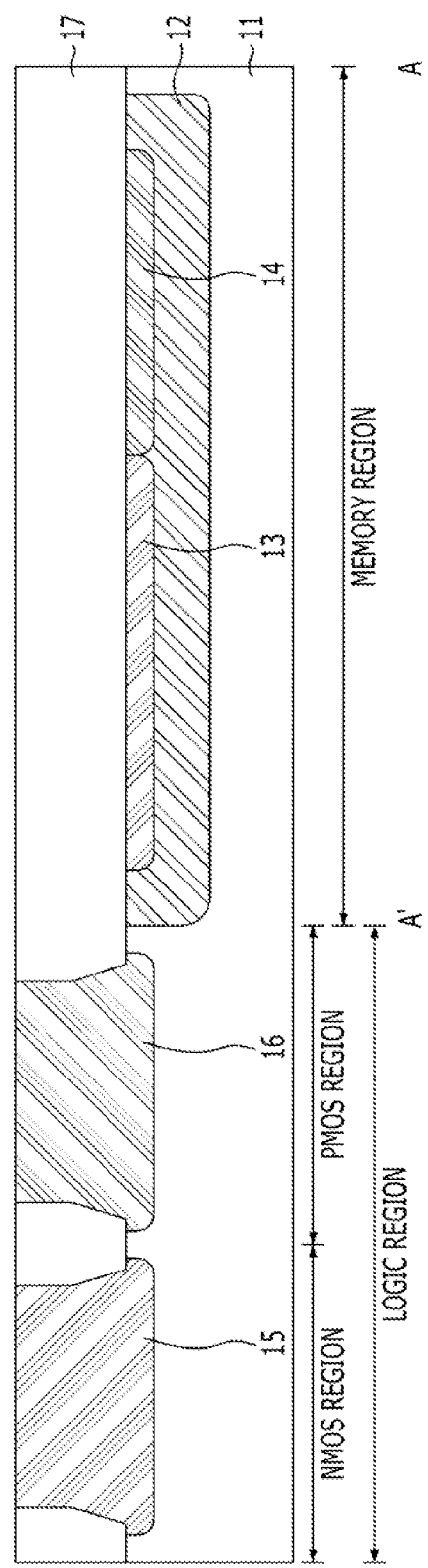

Referring to FIGS. 2A and 3A, a substrate 11 having a logic region and a memory region is prepared. The logic region may include an NMOS region and a PMOS region, and the memory region may be a region where the nonvolatile memory device in accordance with the embodiment is to be formed. The substrate 11 may use a semiconductor substrate. The semiconductor substrate may be a single crystalline state, and may include a silicon-containing substance. In other words, the semiconductor substrate may include a single crystalline silicon-containing substance. For instance, as the substrate 11, a bulk silicon substrate or a silicon-on-insulator (SOI) substrate may be used.

By ion-implanting impurities of the second conductivity type into the memory region, a deep well 12 of the second conductivity type is formed. A P-type well 15 and an N-type well 16 are formed in the NMOS region and the PMOS region, of the logic region, respectively. A first well 13 of the first conductivity type and a second well 14 of the second conductivity type are formed in the memory region. The deep well 12, the first well 13, the second well 14, the P-type well 15 and the N-type well 16 may be formed through a series of processing procedures of forming mask patterns (not shown) serving as an ion implantation barrier on the substrate 11, ion-implanting impurities into the substrate 11, removing the mask patterns and performing annealing to activate the implanted impurities. Wells with the same implantation depth and the same conductivity type may be simultaneously formed.

A plurality of active regions are defined by forming an isolation layer 17 in the substrate 11. In detail, by forming the isolation layer 17, a first active region 32 and a pick-up region 33 may be defined in the first well 13 of the memory region, and a second active region 34 may be defined in the second well 14 of the memory region. The isolation layer 17 may be formed through an STI process. The STI process means a series of processes of forming the isolation layer 17 by defining trenches for isolation in the substrate 11 and filling a dielectric substance in the trenches.

Figure 2B:
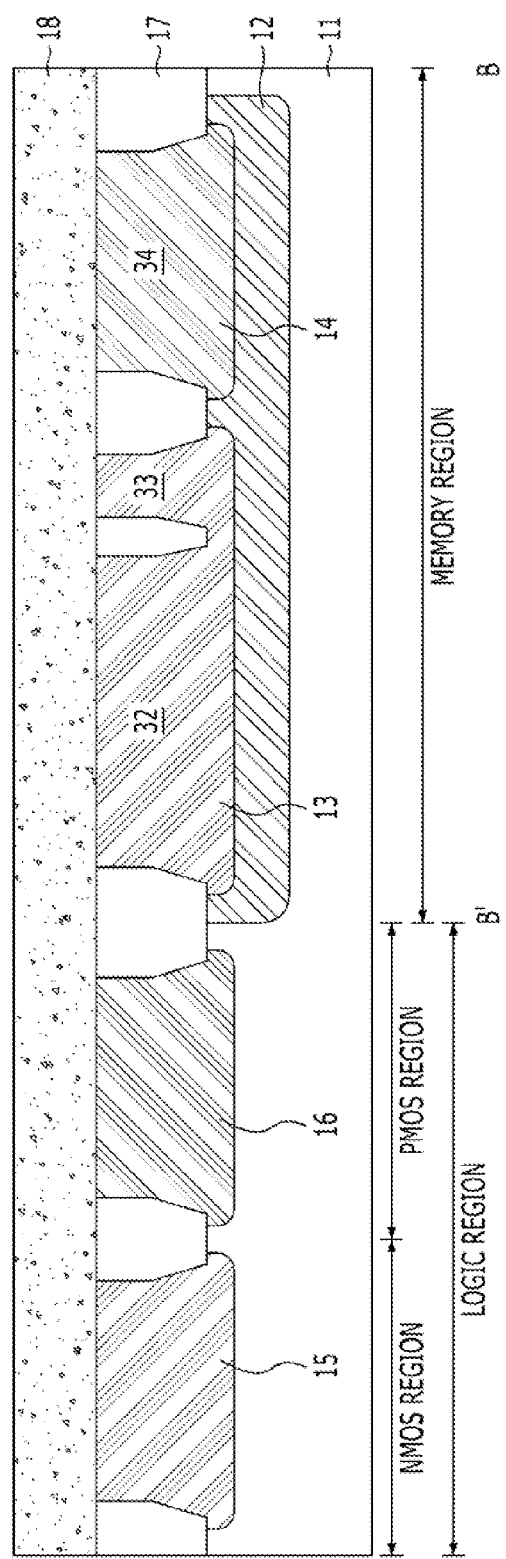
Figure 3B:
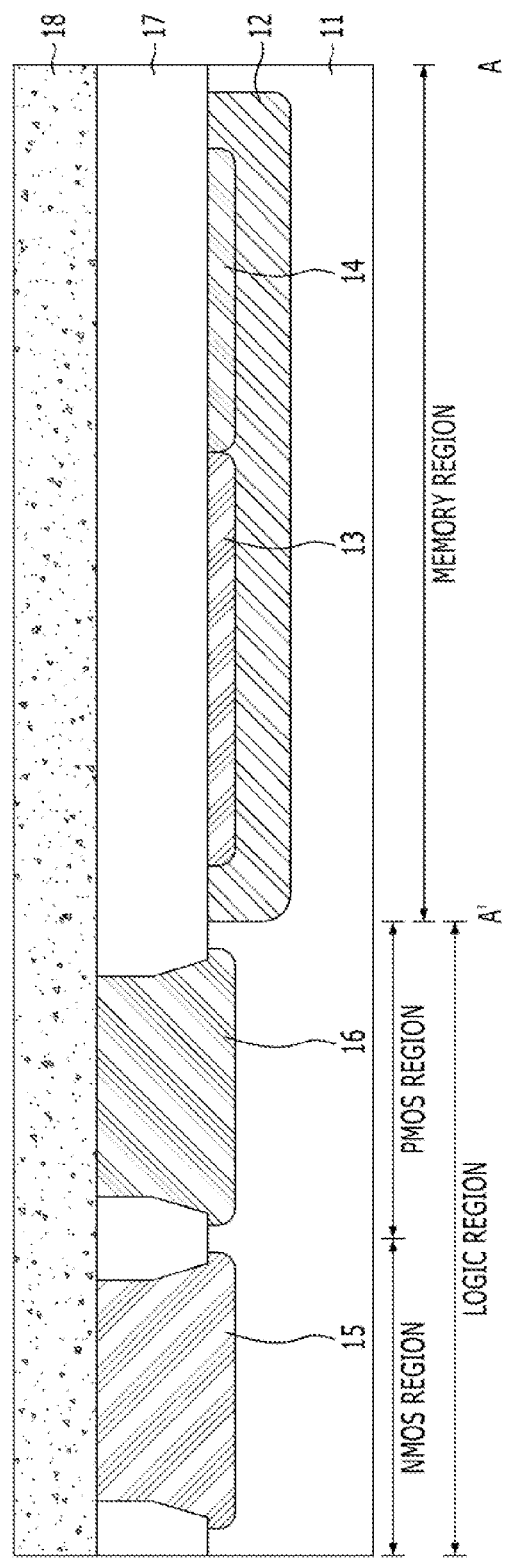

Referring to FIGS. 2B and 3B, a gate dielectric layer (not shown) is formed on the entire surface of the substrate 11. The gate dielectric layer may be formed as a single layer selected from the group that includes an oxide layer, a nitride layer and an oxynitride layer, or a stack layer of at least two layers thereof.

A gate conductive layer 18 is formed on the gate dielectric layer. The gate conductive layer 18 may be formed of a silicon-containing substance, and a silicon layer may be used as the silicon-containing substance. For instance, the gate conductive layer 18 may be formed as a polysilicon layer.

Impurities are ion-implanted into portions of the gate conductive layer 18, which correspond to the NMOS region, the PMOS region, and the memory region. This is to provide characteristics (for example, work functions) of the gate conductive layer 18, which are demanded in the respective regions. For example, impurities of the first conductivity type may be ion-implanted into the portion of the gate conductive layer 18, corresponding to the PMOS region, and impurities of the second conductivity type may be ion-implanted into the portion of the gate conductive layer 18, corresponding to the NMOS region. According to a channel type of a memory, impurities may not be ion-implanted into the portion of the gate conductive layer 18, corresponding to the memory region, or predetermined impurities may be ion-implanted into the portion of the gate conductive layer 18, corresponding to the memory region. For instance, impurities of the second conductivity type may be ion-implanted into the portion of the gate conductive layer 18, corresponding to the memory region.

Figure 2C:
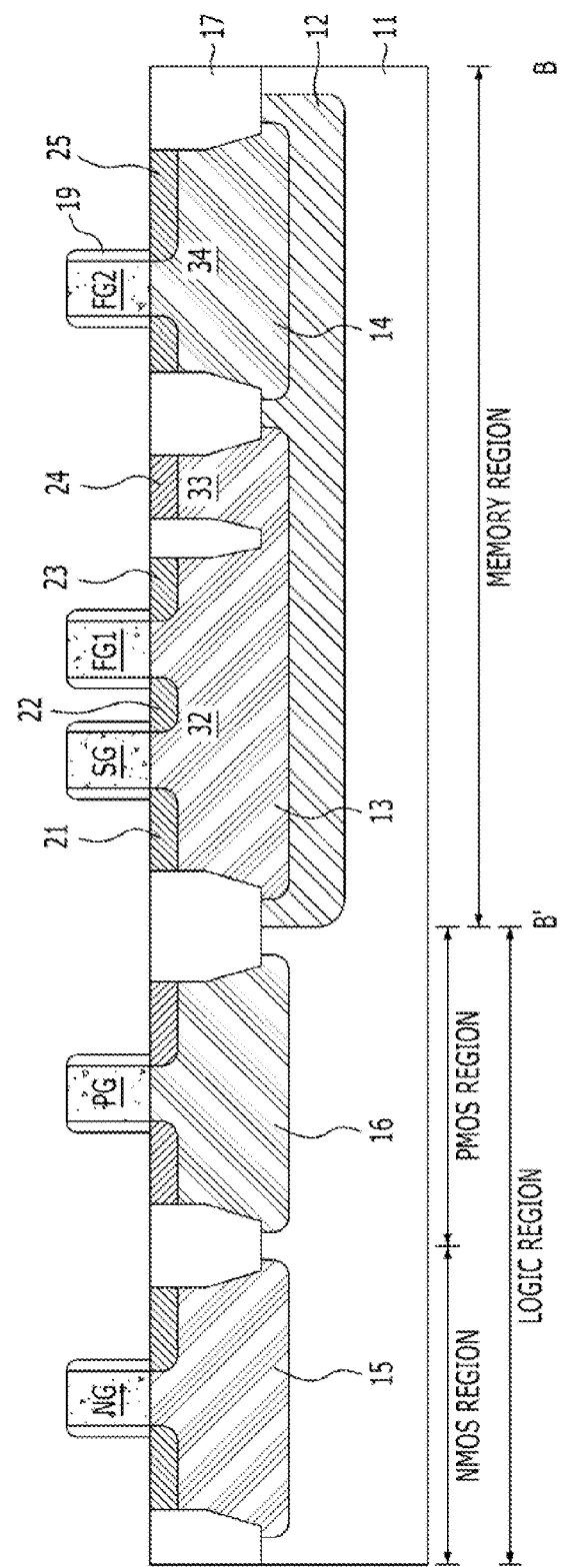
Figure 3C:
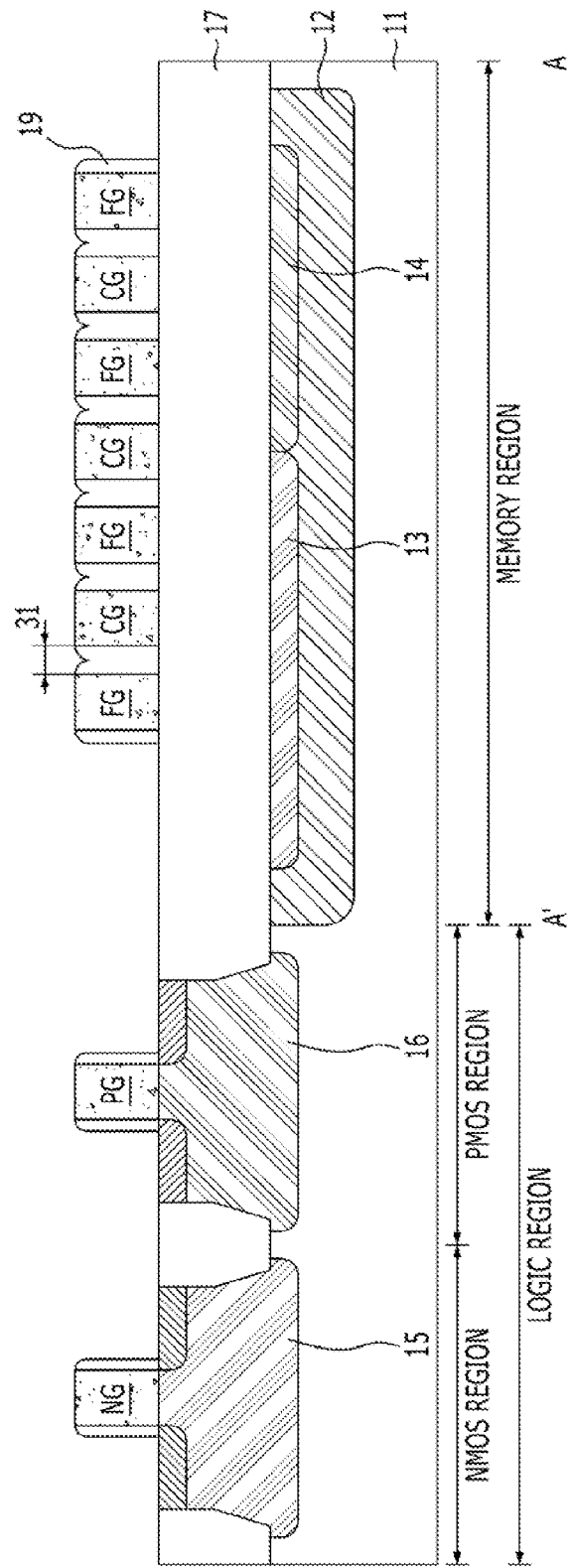

Referring to FIGS. 2C and 3C, after forming mask patterns (not shown) on the gate conductive layer 18, by sequentially etching the gate conductive layer 18 and the gate dielectric layer using the mask patterns as an etch barrier, a plurality of gates NG, PG, CG, FG and SG are formed. In detail, a first gate NG and a second gate PG are respectively formed in the NMOS region and the PMOS region. In the memory region, a multi-finger type control gate CG is formed on the isolation layer 17, a multi-finger type floating gate FG, which is close to the control gate CG with gaps 31 defined therebetween and includes a first extension part FG1 and a second extension part FG2 extending to the first active region 32 and the second active region 34, respectively, is formed on the isolation layer 17, and a select gate SG is formed on the first active region 32. All of the first gate NG, the second gate PG, the control gate CG, the floating gate FG and the select gate SG may be simultaneously formed through one etching process.

By performing an impurity ion implantation process, junction regions are formed in the substrate 11 on both sides of the plurality of gates NG, PG, CG, FG and SG. Junction regions with the same conductivity type may be simultaneously formed. In detail, an N-type junction region is formed in the NMOS region, and a P-type junction region is formed in the PMOS region. In the memory region, a drain region 21 adjacent to the select gate SG, a connection region 22 between the select gate SG and the first extension part FG1, a source region 23 adjacent to the first extension part FG1, a first impurity region 24 of the pick-up region 33, and a second impurity region 25 adjacent to the second extension part FG2 are formed. The source region 23, the drain region 21, the connection region 22, and the second impurity region 25 may be the second conductivity type, and the first impurity region 24 may be the first conductivity type.

Spacers 19 are formed on the sidewalls of the plurality of gates NG, PG, CG, FG and SG. The spacers 19 are formed to fill the gaps 31 between the control gate CG and the floating gate FG. The spacers 19 may be formed as a dielectric layer, for example, a single layer selected from the group that includes an oxide layer, a nitride layer and an oxynitride layer, or a stack layer of at least two layers thereof. The spacers 19 may be formed through a series of processes of depositing a dielectric layer on the surface of the structure including the plurality of gates NG, PG, CG, FG and SG to fill the gaps 31 and then performing blanket etching, for example, etch-back.

Figure 2D:
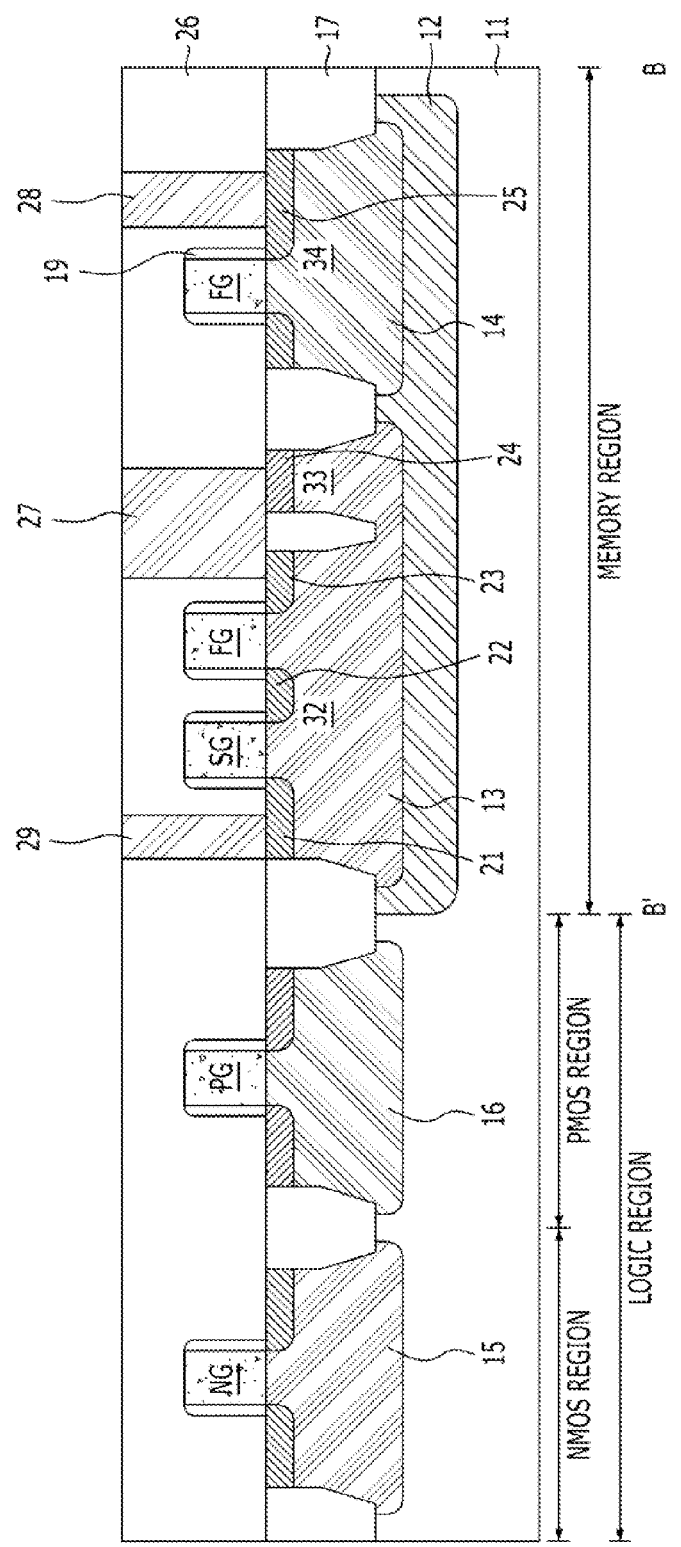
Figure 3D:
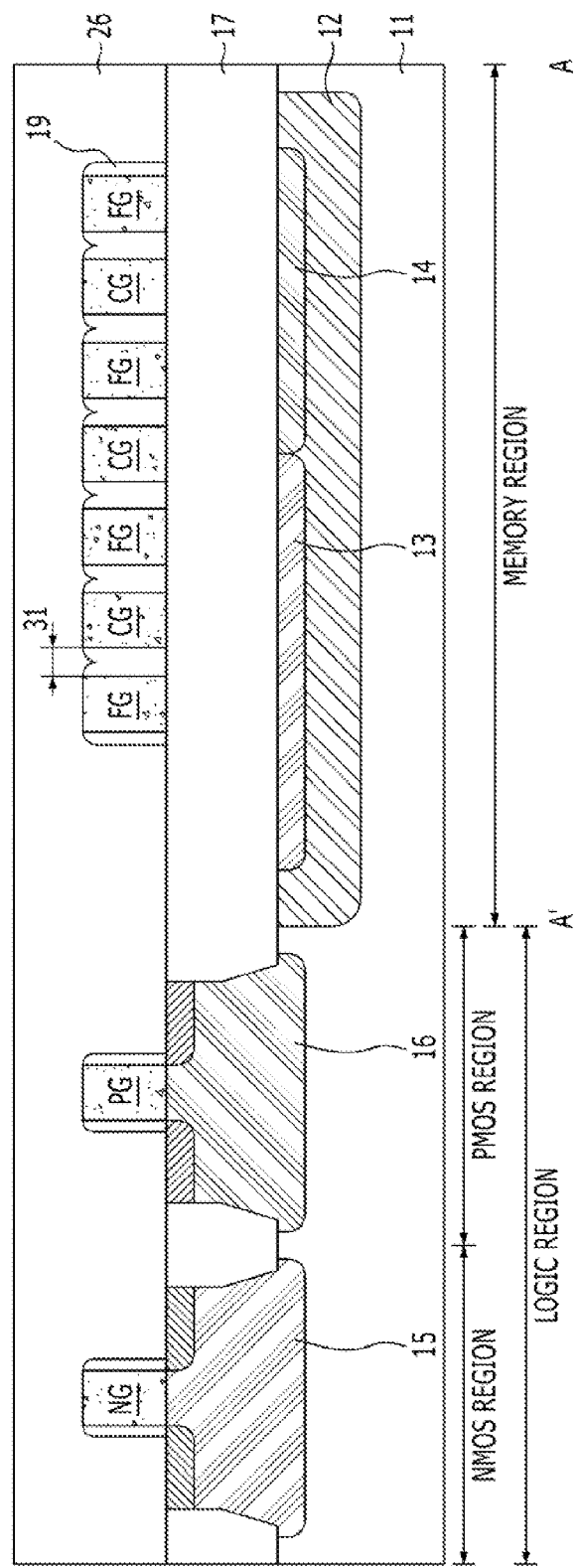

Referring to FIGS. 2D and 3D, an interlayer dielectric layer 26 is formed to cover the entire surface of the substrate 11 including the plurality of gates NG, PG, CG, FG and SG. The interlayer dielectric layer 26 may be formed as a single layer selected from the group that includes an oxide layer, a nitride layer and an oxynitride layer, or a stack layer of at least two layers thereof.

A plurality of plugs that pass through the interlayer dielectric layer 26 are formed. In detail, a first plug 27 that is connected with the first impurity region 24 of the pick-up region 33 and the source region 23, a second plug 28 that is connected with the second impurity region 25, and a third plug 29 that is connected with the drain region 21, may be formed through the interlayer dielectric layer 26.

Some of the plurality of gates NG, PG, CG, FG and SG may be formed in the plug forming process. For instance, the control gate CG may not be formed in the processes for forming the plurality of gates NG, PG, CG, FG and SG, and may be formed in the plug forming process. This process may be applied in the case where it is necessary to individually control substances that constitute the plurality of gates NG, PG, CG, FG and SG. In detail, the control gate CG may be formed in such a manner that the floating gate FG is formed before forming the interlayer dielectric layer 26, openings, which neighbor the floating gate FG with the gaps 31 defined therebetween, are defined after forming the interlayer dielectric layer 26, and a conductive substance is filled in the openings.

Then, while not shown in a drawing, the nonvolatile memory device may be completely fabricated according to a well-known semiconductor device fabrication technology that includes a process for forming a conductive line on the interlayer dielectric layer 26.

As can be readily seen from the above descriptions, since the nonvolatile memory device in accordance with the embodiment conforms to a logic process, a nonvolatile memory device with the control gate CG, the floating gate FG, and the select gate SG may be fabricated without using a separate process.

Figure 4:
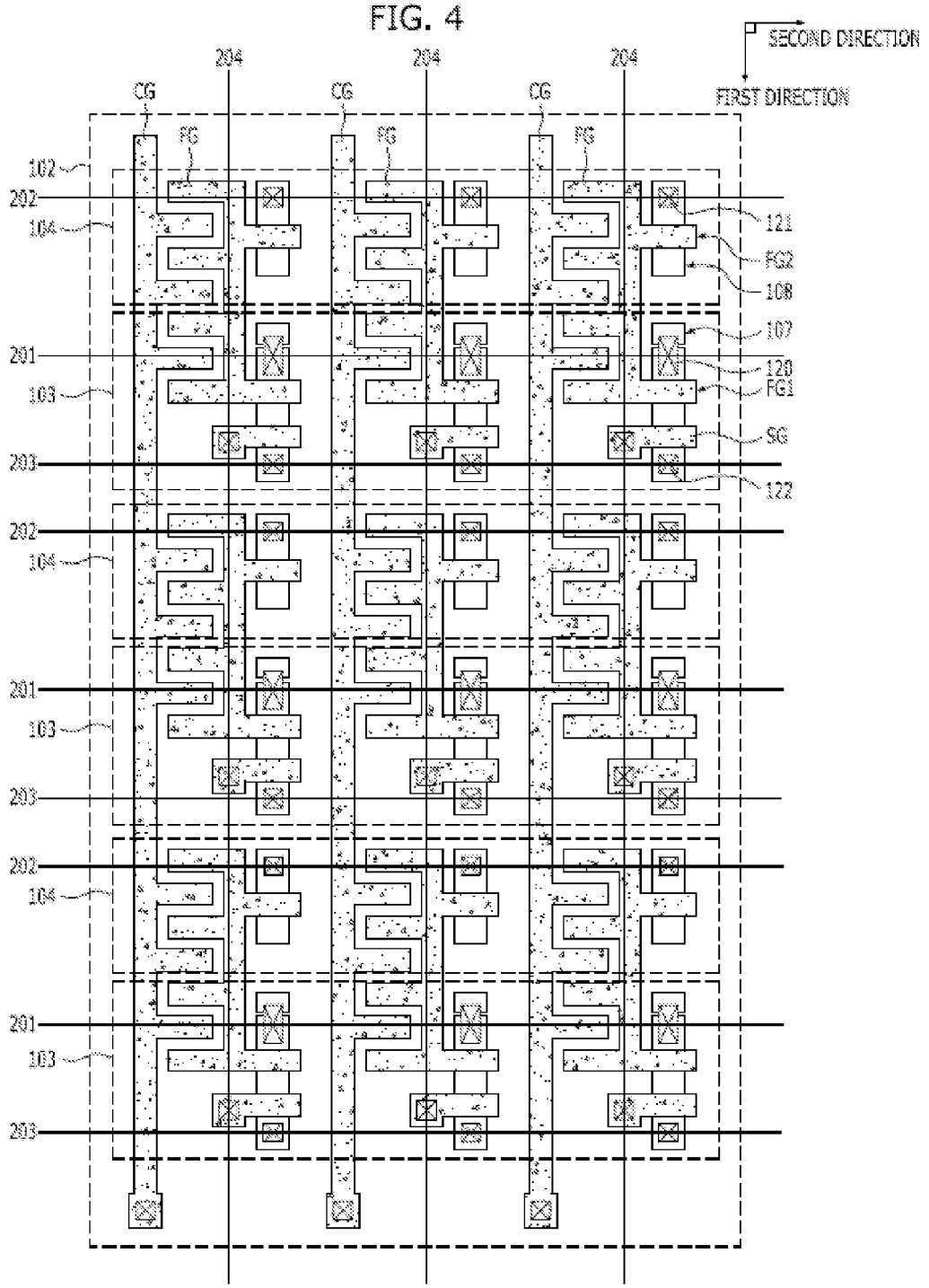
FIGS. 4 and 5 are views illustrating a cell array of the nonvolatile memory device in accordance with the embodiment of the present invention.
Figure 5:
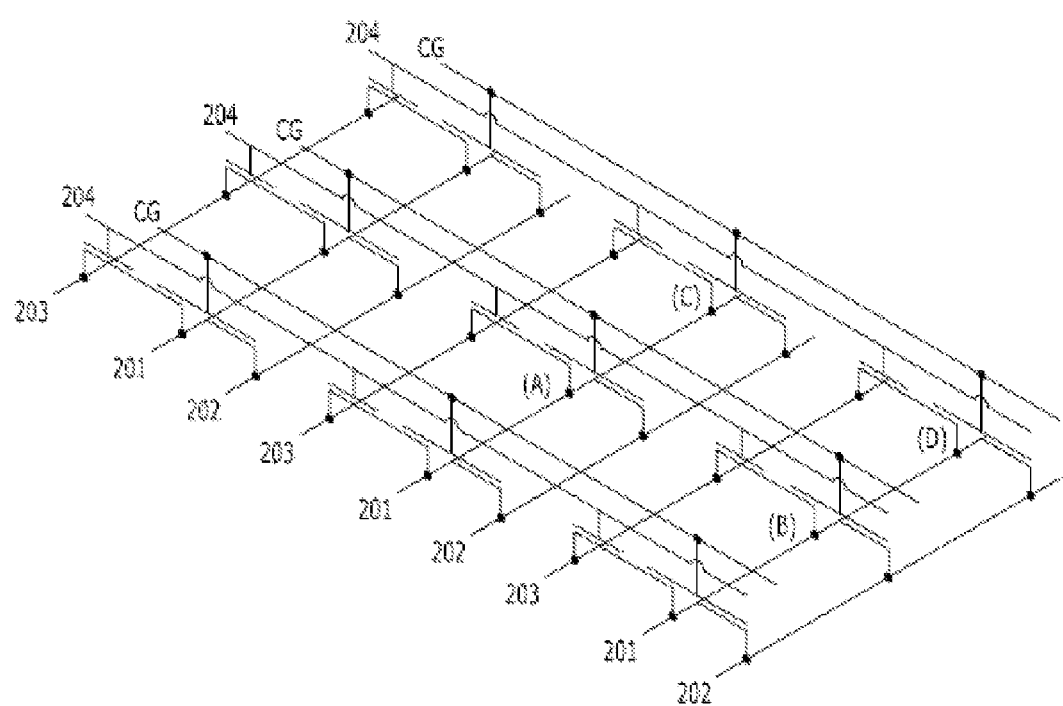

Hereinbelow, a cell array including the unit cell of the nonvolatile memory device in accordance with the embodiment and a cell array operation method will be described with reference to FIGS. 4 and 5 and Table 2. FIGS. 4 and 5 are illustrated by exemplifying the case where unit cells are disposed in a 3×3 layout. For the convenience in explanation, the same reference numerals will be used to refer to the same components that are expressed by the same terms even though the shapes of the components are slightly different from those shown in FIGS. 1A to 1C, and detailed descriptions thereof will be omitted.

FIGS. 4 and 5 are views illustrating a cell array of the nonvolatile memory device in accordance with the embodiment of the present invention, wherein FIG. 4 is a plan view and FIG. 5 is an equivalent circuit diagram. The cross-sectional shape of each unit cell will be described with reference to FIGS. 1B and 1C.

Referring to FIGS. 4 and 5, a cell array of the nonvolatile memory device in accordance with the embodiment includes a second conductivity type deep well 102 formed in a substrate 101, and a plurality of first conductivity type first wells 103 and a plurality of second conductivity type second wells 104 that are formed in the deep well 102. The first wells 103 and the second wells 104 may have shapes that are alternately disposed in a first direction while one of sidewalls thereof adjoins each other. The first wells 103 and the second wells 104 may have bar type shapes or line type shapes that extend in a second direction. Accordingly, a plurality of unit cells may have shapes that share the first well 103 and the second well 104 in the second direction.

The cell array of the nonvolatile memory device in accordance with the embodiment further includes an isolation layer 105, which is formed in the substrate 101 and defines, in each unit cell, a first active region 106 and a pick-up region 107 in the first well 103 and a second active region 108 in the second well 104. A portion of the first well 103 and a portion of the second well 104 may be opened by the isolation layer 105, and may be respectively defined as the first active region 106 and the second active region 108. The first active region 106 and the second active region 108 may be bar types, which have major axes and minor axes, or line types. The pick-up region 107 is a region for applying a bias to the first well 103. A portion of the first well 103 may be open by the isolation layer 105 and may be defined as the pick-up region 107. The pick-up region 107 may have a shape that is disposed on one side of the first active region 106 to be separated from the first active region 106 by the isolation layer 105, or may have a shape that is adjacent to one side of the first active region 106.

The cell array of the nonvolatile memory device in accordance with the embodiment further includes a floating gate FG that is formed on the isolation layer 105, a control gate CG that is formed on the isolation layer 105 and disposed close to the floating gate FG with gaps 111 defined therebetween, and spacers 112 and 113 that are formed on the sidewalls of the floating gate FG and the control gate CG and fill the gaps 111. The floating gate FG and the control gate CG may be disposed on the same plane and may have shapes in which at least one of sidewalls thereof face each other.

In the cell array of the nonvolatile memory device in accordance with the embodiment, the floating gate FG and the control gate CG are multi-finger types. This is to increase the coupling rate between the control gate CG and the floating gate FG. To this end, the control gate CG and the floating gate FG may have shapes in which multiple fingers thereof are alternately arranged with each other, that is, interdigitate with each other. The floating gate FG may be disposed in a shape that corresponds to each unit cell, and the control gate CG may have a shape that includes a line type body extending in the first direction and multiple fingers corresponding to respective unit cells.

In the cell array of the nonvolatile memory device in accordance with the embodiment, the floating gate FG includes a first extension part FG1, which extends to and overlaps with the first active region 106, and a second extension part FG2, which extends to and overlaps with the second active region 108. The first extension part FG1 plays a role of providing a path through which charges, that is, electrons or holes, are injected into the floating gate FG from the first well 103 in the program operation and permitting a threshold voltage change by which presence and absence of charges in the floating gate FG in the read operation may be determined. The second extension part FG2 plays a role of providing a path through which charges in the floating gate FG are discharged into the second well 104 in the erase operation.

The cell array of the nonvolatile memory device in accordance with the embodiment further includes a select gate SG that is formed on the first active region 106 and is disposed side by side with the first extension part FG1 of the floating gate FG while being separated therefrom by a predetermined distance, spacers 114 that are formed on the sidewalls of the select gate SG, a drain region 115 that is formed in the first active region 106 adjacent to the select gate SG, a source region 117 that is formed in the first active region 106 adjacent to the first extension part FG1, and a connection region 116 that is formed in the first active region 106 between the select gate SG and the first extension part FG1. The select gate SG is for the read operation, and the distance between the first extension part FG1 and the select gate SG may be substantially the same or greater than the distance between the floating gate FG and the control gate CG in the coupling region 110, that is, the gap 111. The connection region 116 may serve as a conductive path that connects a channel induced by the select gate SG and a channel induced by the first extension part FG1. The source region 117, the drain region 115 and the connection region 116 may be formed by ion-implanting impurities of the second conductivity type into the substrate 101 and may have LDD structures.

The cell array of the nonvolatile memory device in accordance with the embodiment further includes a first node 120 that is connected with the pick-up region 107, a second node 121 that is connected with the second active region 108, and a third node 122 that is connected with the drain region 115 of the first active region 106. The first node 120 may be connected to not only the pick-up region 107 but also the source region 117 of the first active region 106. Namely, the pick-up region 107 and the source region 117 of the first active region 106 may share the first node 120.

The first node 120 means a structure for applying a bias, for example, a bias for the program operation, to the first well 103, and may include a first impurity region 118 that is formed in the pick-up region 107 and a first plug (not shown) on the first impurity region 118. The first impurity region 118 may be formed by ion-implanting impurities of the first conductivity type and may have an impurity doping concentration higher than that of the first well 103. The second node 121 means a structure for applying a bias, for example, a bias for the erase operation, to the second well 104, and may include a second impurity region 119 that is formed in the second active region 108 on one side of the second extension part FG2 and a second plug (not shown) on the second impurity region 119. The second impurity region 119 may be formed by ion-implanting impurities of the second conductivity type and may have an impurity doping concentration higher than that of the second well 104. The third node 122 means a structure for applying a bias for the read operation, and may include the drain region 115 and a third plug (not shown) on the drain region 115.

The cell array of the nonvolatile memory device in accordance with the embodiment further includes first conductive lines 201 that extend in the second direction and are connected with a plurality of first nodes 120, second conductive lines 202 that extend in the second direction and are connected with a plurality of second nodes 121, third conductive lines 203 that extend in the second direction and are connected with a plurality of third nodes 122, and fourth conductive lines 204 that extend in the first direction and are connected with a plurality of select gates SG. The first conductive lines 201 to the third conductive lines 203 may have shapes that extend in the second direction and are separated from one another by predetermined distances in the first direction so that one first conductive line 201 to one third conductive line 203 are connected with a plurality of first nodes 120 to a plurality of third nodes 122 that are disposed in the second direction. The fourth conductive lines 204 may have shapes, which extend in the first direction and are separated from one another by a predetermined distance, so that each fourth conductive line 204 is connected with a plurality of select gates SG that are disposed in the first direction.

Hereinbelow, operations of the cell array of the nonvolatile memory device in accordance with the embodiment will be described with reference to FIGS. 4 and 5 and Table 2. Table 2 shows exemplary operating conditions of the cell array of the nonvolatile memory device in accordance with the embodiment. In Table 2, a 'selected cell (A)' means a unit cell as a target of a program operation, an erase operation and a read operation. An 'unselected cell (B)' means a unit cell that shares the control gate CG and the fourth conductive line 204 with the 'selected cell (A)', but does not share the first conductive line 201 to the third conductive line 203 with the 'selected cell (A)'. An 'unselected cell (C)' means a unit cell that shares the first conductive line 201 to the third conductive line 203 with the 'selected cell (A)', but does not share the control gate CG and the fourth conductive line 204 with the 'selected cell (A)'. An 'unselected cell (D)' means a unit cell that does not share the control gate CG and the first conductive line 201 to the fourth conductive line 204 with the 'selected cell (A)'.

TABLE 2

| | | Classification | | |
|---|---|---|---|---|
| | | Program | Erase | Read |
| | | Scheme | | |
| | | FN tunneling | FN tunneling | — |
| | | Minimum Operation Unit | | |
| | | Bit | Page, Byte, Bit | Random Access |
| Selected Cell (A) | Control Gate | VPP | −VPP | VSS |
| | First Cond. Line | −VPP | VSS | VSS |
| | Second Cond. Line | VSS | VPP | VSS |
| | Third Cond. Line | VSS | VSS | Vread (~1 V) |
| | Fourth Cond. Line | VSS | VSS | VCC |

TABLE 2-continued

| | | Classification | | |
|---|---|---|---|---|
| | | Program | Erase | Read |
| | | Scheme | | |
| | | FN tunneling | FN tunneling | — |
| | | Minimum Operation Unit | | |
| | | Bit | Page, Byte, Bit | Random Access |
| Unselected Cell (B) | Control Gate | VPP | −VPP | VSS |
| | First Cond. Line | VSS | VSS | VSS |
| | Second Cond. Line | VSS | VPP | VSS |
| | Third Cond. Line | VSS | VSS | VSS |
| | Fourth Cond. Line | VSS | VSS | VCC |
| Unselected Cell (C) | Control Gate | VSS | VSS | VSS |
| | First Cond. Line | −VPP | VSS | VSS |
| | Second Cond. Line | VSS | VPP | VSS |
| | Third Cond. Line | VSS | VSS | Vread (~1 V) |
| Unselected Cell (D) | Control Gate | VSS | VSS | VSS |
| | First Cond. Line | VSS | VSS | VSS |
| | Second Cond. Line | VSS | VPP | VSS |
| | Third Cond. Line | VSS | VSS | VSS |
| | Fourth Cond. Line | VSS | VSS | VSS |

First, a program operation may use an FN tunneling scheme, and programming may be implemented by the unit of each unit cell, that is, by the unit of a bit. In detail, the selected cell A may be programmed to supply a pumping voltage VPP and a minus pumping voltage −VPP with different polarities to the control gate CG of the selected cell A and the first conductive line 201, respectively. Although the floating gate FG of the unselected cell B that shares the control gate CG with the 'selected cell (A)' is coupled, since a ground voltage VSS is supplied to the first conductive line 201 that is connected with the unselected cell B, the unselected cell B is not programmed. Also, in the case of the unselected cell C and the unselected cell D, since the ground voltage VSS is supplied to the control gates CG and thus the floating gates FG thereof are not coupled, the unselected cell C and the unselected cell D are not programmed.

Second, an erase operation may use an FN tunneling scheme, and erasing may be implemented by the unit of a page, by the unit of a byte and by the unit of a bit. In detail, the selected cell A may be erased to supply the minus pumping voltage −VPP and the pumping voltage VPP with different polarities to the control gate CG of the selected cell A and the second conductive line 202, respectively. Since the pumping voltage VPP supplied through the second conductive line 202 is transferred to the second well 104 through the second node 121, and the pumping voltage VPP transferred to the second well 104 is supplied to all of a plurality of second wells 104 by the deep well 102, it may be possible to simultaneously erase the selected cell A and the unselected cell B that share the control gate CG. Although the pumping voltage VPP is supplied to all of the plurality of second wells 104, the unselected cell C and the unselected cell D that have control gates CG supplied with the ground voltage VSS, are not erased.

Third, in a read operation, the selected cell A may be read to supply a read voltage Vread and a power supply voltage VCC to the third conductive line 203 and the fourth conductive line 204, respectively. In the unselected cell B to the unselected cell D, because the ground voltage VSS is supplied to the third conductive line 203 and/or the fourth conductive line 204, the unselected cell B to the unselected cell D are not read.

Hereinbelow, exemplary application fields of the nonvolatile memory device in accordance with the embodiment will be schematically described with reference to FIGS. 6 and 7.

Figure 6:
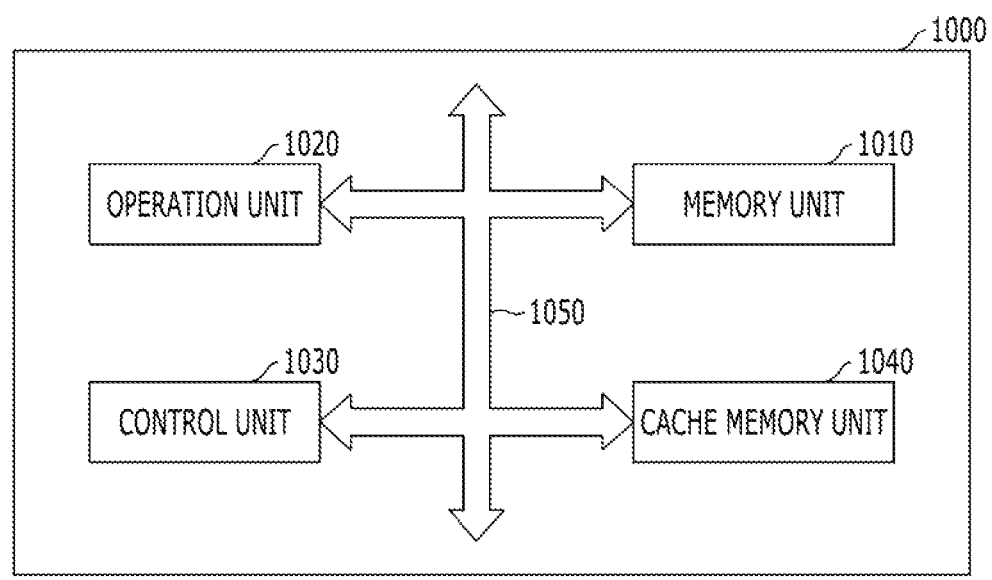
FIG. 6 is a configuration diagram of a microprocessor in accordance with another embodiment of the present invention.

FIG. 6 is a configuration diagram of a microprocessor in accordance with another embodiment of the present invention.

Referring to FIG. 6, a microprocessor 1000 performs tasks for controlling and tuning a series of processes of receiving data from various external devices, processing the data, and outputting processing results to external devices. The microprocessor 1000 includes a memory unit 1010, an operation unit 1020, and a control unit 1030. The microprocessor 1000 may be various processing units such as a central processing unit (CPU), a graphic processing unit (GPU), a digital signal processor (DSP) or an application processor (AP).

The memory unit 1010 is a part that stores data in the microprocessor 1000, as a processor register or a register. The memory unit 1010 may include a data register, an address register and a floating point register. Besides, the memory unit 1010 may include various registers according to design considerations. The memory unit 1010 may perform the function of temporarily storing addresses where data for which operations are to be performed by the operation unit 1020. In addition, result data of performing the operations and data for performing of the operations may be stored.

The memory unit 1010 may include the above-described nonvolatile memory device. The memory unit 1010 including the semiconductor device in accordance with the aforementioned embodiment may include a multi-finger type control gate formed over a substrate, a multi-finger type floating gate formed over the substrate and disposed close to the control gate with gaps defined therebetween, and spacers formed on the sidewalls of the control gate and the floating gate to fill the gaps, so that the degree of integration may be improved and it may be possible to conform to a logic process to allow the memory unit 1010 to be fabricated without a separate process. Through this, the size of the memory unit 1010 may be minimized, and the capacity of the memory unit 1010 may be maximized while using the same space. In order to scale down the microprocessor 1000, the memory unit 1010 of a small size may be needed. Also, in order to improve the performance of the microprocessor 1000, increasing the capacity of the memory unit 1010 is required. In the embodiment, because the size of the memory unit 1010 may be minimized and the capacity of the memory unit 1010 may be increased, the microprocessor 1000 may be scaled down and may have high performance.

The operation unit 1020 is a part that performs operations in the microprocessor 1000. The operation unit 1020 performs four arithmetical operations or logical operations according to results that the control unit 1030 decodes commands. The operation unit 1020 may include at least one arithmetic logic unit (ALU).

The control unit 1030 receives signals from the memory unit 1010, the operation unit 1020, and an external device of the microprocessor 1000. The control unit 1030 controls extraction, decoding, input and output of commands, and executes processing represented by programs.

The microprocessor 1000 according to the present embodiment additionally includes a cache memory unit 1040 that may temporarily store data to be inputted from an external device other than the memory unit 1010 or to be outputted to an external device. In this case, the cache memory unit 1040 may exchange data with the memory unit 1010, the operation unit 1020, and the control unit 1030 through a bus interface 1050.

FIG. 7 is a configuration diagram of a processor in accordance with another embodiment of the present invention.

Referring to FIG. 7, a processor 1100 improves performance and realizes multi-functionality by including various functions other than those of a microprocessor that performs tasks for controlling and tuning a series of processes of receiving data from various external devices, processing the data, and outputting processing results to external devices. The processor 1100 includes a core block 1110, a cache memory unit 1120, and a bus interface 1130. The core block 1110 of the present embodiment is a part that performs arithmetic logic operations for data inputted from an external device. The core block 1110 includes a memory unit 1111, an operation unit 1112 and a control unit 1113. The processor 1100 may be various system-on-chips (SoCs) such as a multi-core processor, a graphic processing unit (GPU) or an application processor (AP).

The memory unit 1111 is a part that stores data in the processor 1100, as a processor register or a register. The memory unit 1111 may include a data register, an address register and a floating point register. Besides, the memory unit 1111 may include various registers according to design considerations. The memory unit 1111 may perform the function of temporarily storing addresses where data for which operations are to be performed by the operation unit 1112. In addition, result data of performing the operations and data for performing of the operations may be stored. The operation unit 1112 is a part that performs operations in the processor 1100. The operation unit 1112 performs four arithmetical operations or logical operations according to results that the control unit 1113 decodes commands. The operation unit 1112 may include at least one arithmetic logic unit (ALU). The control unit 1113 receives signals from the memory unit 1111, the operation unit 1112 and an external device of the processor 1100. The control unit 1113 controls extraction, decoding, input and output of commands, and executes processing represented by programs.

The cache memory unit 1120 is a part that temporarily stores data to compensate for a difference in data processing speed between the core block 1110 operating at a high speed and an external device operating at a low speed. The cache memory unit 1120 may include a primary storage section 1121, a secondary storage section 1122, and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections, which are included in the cache memory unit 1120, may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be fastest. Although it was shown in FIG. 7 that all the primary, secondary and tertiary storage sections 1121, 1122 and 1123 are configured in the cache memory unit 1120, it is to be noted that all the primary, secondary, and tertiary storage sections 1121, 1122 and 1123 of the cache memory unit 1120 may be configured outside of the core block 1110 and may compensate for a difference in data processing speed between the core block 1110 and the external device. Meanwhile, it is to be noted that the primary storage section 1121 of the cache memory unit 1120 may be disposed in the core block 1110, and the secondary storage section 1122 and the tertiary storage section 1123 may be configured outside of the core block 1110 to strengthen the function of compensating for a difference in data processing speed.

The bus interface 1130 is a part that connects the core block 1110 and the cache memory unit 1120 and allows data to be efficiently transmitted.

The processor 1100 according to the present embodiment includes a plurality of core blocks 1110, and the plurality of core blocks 1110 may share the cache memory unit 1120. The plurality of core blocks 1110 and the cache memory unit 1120 are connected through the bus interface 1130. The plurality of core blocks 1110 may be configured in the same way as the above-described configuration of the core block 1110. In the case where the processor 1100 includes the plurality of core block 1110, the primary storage section 1121 of the cache memory unit 1120 may be configured in each core block 1110 in correspondence to the number of the plurality of core blocks 1110, and the secondary storage section 1122 and the tertiary storage section 1123 may be configured outside of the plurality of core blocks 1110 to be shared through the bus interface 1130. The processing speed of the primary storage section 1121 may be faster than the processing speeds of the secondary and tertiary storage section 1122 and 1123.

The processor 1100 according to the present embodiment further includes an embedded memory unit 1140 that stores data, a communication module unit 1150 that may transmit data to and receive data from an external device in a wired or wireless manner, a memory control unit 1160 that drives an external memory device, and a media processing unit 1170 that processes the data prepared in the processor 1100 or the data inputted from an external input device and outputs the processed data to an external interface device. Besides, the processor 1100 may include a plurality of modules. In this case, the plurality of modules that are added may exchange data with the core blocks 1110 and the cache memory unit 1120 through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and so on. In particular, the embedded memory unit 1140 may include the nonvolatile memory device according to the above-described embodiment as a nonvolatile memory. The embedded memory unit 1140 including the semiconductor device in accordance with the aforementioned embodiment may include a multi-finger type control gate formed over a substrate, a multi-finger type floating gate formed over the substrate and disposed close to the control gate with gaps defined therebetween, and spacers formed on the sidewalls of the control gate and the floating gate to fill the gaps, so that the degree of integration may be improved, and it may be possible to conform to a logic process to allow the embedded memory unit 1140 to be fabricated without a separate process. Through this, the size of the embedded memory unit 1140 may be minimized, and the capacity of the embedded memory unit 1140 may be maximized while using the same space. In order to scale down the processor 1100, the embedded memory unit 1140 of a small size may be needed. Also, in order to improve the performance of the processor 1100, increasing the capacity of the embedded memory unit 1140 is required. In the embodiment, because the size of the embedded memory unit 1140 may be minimized and the capacity of the embedded memory unit 1140 may be increased, the processor 1100 may be scaled down and may have high performance.

The communication module unit 1150 may include both a module that may be connected with a wired network and a module that may be connected with a wireless network. The wired network module may include a local area network (LAN), a universal serial bus (USB), an Ethernet, power line communication (PLC), and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), and so on.

The memory control unit 1160 may administrate data transmitted between the processor 1100 and an external storage device operating according to a different communication standard. The memory control unit 1160 may include various memory controllers, for example, controllers for controlling IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 processes the data processed in the processor 1100 and the data inputted from the external input device, and outputs the processed data to the external interface device to be transmitted in the forms of image, voice and others. The media processing unit 1170 may include a graphic processing unit (GPU), a digital signal processor (DSP), a high definition audio (HD audio), a high definition multimedia interface (HDMI) controller, and so on.

As is apparent from the above descriptions, in the nonvolatile memory device and the method for fabricating the same in accordance with the embodiments, since a control gate is provided, the degree of integration of the nonvolatile memory device may improve.

Also, in the nonvolatile memory device and the method for fabricating the same in accordance with the embodiments, since multi-finger type floating gate and control gate are provided, the coupling rate between them may increase.

Furthermore, in the nonvolatile memory device and the method for fabricating the same in accordance with the embodiments, since the floating gate and the control gate are disposed on the same plane so that at least one sidewalls thereof face each other, it may be possible to fabricate the nonvolatile memory device on the basis of a logic process without using a separate additional process.

Moreover, in the nonvolatile memory device and the method for fabricating the same in accordance with the embodiments, since the control gate is disposed on an isolation layer, the occurrence of a fail due to a breakdown of a gate dielectric layer may be prevented, and biases with different polarities may be applied to the control gate and a well, whereby it may be possible to decrease the size of a peripheral circuit for supplying biases to the control gate and the well.

Although various embodiments have been described for illustrative purposes, it will be apparent to those skilled in the art that various changes and modifications may be made without departing from the spirit and scope of the invention as defined in the following claims.

What is claimed is:

1. A nonvolatile memory device comprising:
   a multi-finger type control gate formed over a substrate;
   a multi-finger type floating gate formed over the substrate, and disposed close to the control gate with gaps defined therebetween, wherein the multi-finger type floating gate includes a first extension part and a second extension part extending onto a first active region and a second active region, respectively; and
   spacers formed over sidewalls of the control gate and the floating gate, and filling the gaps.

2. The nonvolatile memory device according to claim 1, wherein the floating gate and the control gate comprise a coupling region where the floating gate and the control gate are disposed to interdigitate with each other.

3. The nonvolatile memory device according to claim 1, further comprising:
   an isolation layer formed in the substrate to define active regions,
   wherein the control gate and the floating gate are disposed over the isolation layer.

4. The nonvolatile memory device according to claim 3, wherein the floating gate comprises extension parts extending onto the active regions.

5. The nonvolatile memory device according to claim 1, wherein a coupling rate between the control gate and the floating gate increases as a width of each of the gaps decreases.

6. The nonvolatile memory device according to claim 1, wherein the floating gate and the control gate are disposed on a same plane so that at least one sidewall of the floating gate and the control gate face each other.

7. A nonvolatile memory device comprising:
   an isolation layer formed over a substrate to define a first active region and a second active region;
   a control gate formed over the isolation layer;
   a floating gate formed over the isolation layer, and disposed close to the control gate with gaps defined therebetween, wherein the floating gate includes a first extension part and a second extension part extending onto the first active region and the second active region, respectively; and
   spacers formed over sidewalls of the control gate and the floating gate, and filling the gaps.

8. The nonvolatile memory device according to claim 7, further comprising:
   a first well formed in the substrate and including the first active region; and
   a second well formed in the substrate, including the second active region, and having a conductivity type complementary to the first well.

9. The nonvolatile memory device according to claim 8, further comprising:
   a deep well formed in the substrate including the first well and the second well and having the same conductivity type as the second well.

10. The nonvolatile memory device according to claim 8, wherein the first well and the second well are disposed side by side so that one of sidewalls thereof contact each other.

11. The nonvolatile memory device according to claim 7, wherein each of the control gate and the floating gate is a multi-finger type.

12. The nonvolatile memory device according to claim 11, wherein the floating gate and the control gate comprise a coupling region where the floating gate and the control gate are disposed to interdigitate with each other.

13. The nonvolatile memory device according to claim 7, wherein the floating gate and the control gate are disposed on a same plane so that at least one sidewall of the floating gate and the control gate face each other.

14. A nonvolatile memory device comprising:
   an isolation layer formed over a substrate to define a first active region, a pick-up region, and a second active region;
   a control gate formed over the isolation layer;
   a floating gate formed over the isolation layer, and disposed close to the control gate with gaps defined therebetween, wherein the floating gate includes a first extension part and a second extension part extending onto the first active region and the second active region, respectively;
   a select gate disposed side by side with the first extension part, over the first active region; and
   spacers formed on sidewalls of the control gate, the floating gate and the select gate, and filling the gaps.

15. The nonvolatile memory device according to claim 14, further comprising:
   a first well formed in the substrate and including the first active region and the pick-up region; and
   a second well formed in the substrate, including the second active region, and having a conductivity type complementary to the first well.

16. The nonvolatile memory device according to claim 15, further comprising:
   a deep well formed in the substrate including the first well and the second well and having the same conductivity type as the second well.

17. The nonvolatile memory device according to claim 14, wherein the first active region and the pick-up region are separated from each other by the isolation layer or adjoin each other.

18. The nonvolatile memory device according to claim 14, wherein the first active region comprises:
   a source region formed adjacent to the first extension part;
   a drain region formed adjacent to the select gate; and
   a connection region formed between the first extension part and the select gate, and
   wherein the source region, the drain region and the connection region have a conductivity type complementary to the first well.

19. The nonvolatile memory device according to claim 18, further comprising:
   a first impurity region formed in the pick-up region; and
   a first node including a first plug over the first impurity region,
   wherein the first impurity region has the same conductivity type as the first well.

20. The nonvolatile memory device according to claim 19, wherein the first plug extends onto the source region, and the first impurity region and the source region share the first node.

21. The nonvolatile memory device according to claim 14, further comprising:
   a second impurity region formed in the second active region on one side of the second extension part; and
   a second node including a second plug over the second impurity region,
   wherein the second impurity region has the same conductivity type as the second well.

22. The nonvolatile memory device according to claim 14, wherein each of the control gate and the floating gate is a multi-finger type.

23. The nonvolatile memory device according to claim 22, wherein the floating gate and the control gate comprise a coupling region where the floating gate and the control gate are disposed to interdigitate with each other.

* * * * *